United States Patent [19]
Pasotti et al.

[11] Patent Number: 6,128,228
[45] Date of Patent: Oct. 3, 2000

[54] CIRCUIT FOR HIGH-PRECISION ANALOG READING OF NONVOLATILE MEMORY CELLS, IN PARTICULAR ANALOG OR MULTILEVEL FLASH OR EEPROM MEMORY CELLS

[75] Inventors: Marco Pasotti, S. Martino Siccomario; Roberto Canegallo, Tortona; Giovanni Guaitini, Trecella; Pier Luigi Rolandi, Monleale, all of Italy

[73] Assignee: STMicroelectronics S.r.l., Agrate Brianza, Italy

[21] Appl. No.: 09/438,823

[22] Filed: Nov. 12, 1999

[30] Foreign Application Priority Data

Nov. 13, 1998 [IT] Italy ................................. TO98A0962

[51] Int. Cl.$^7$ .................................................. G11C 13/00
[52] U.S. Cl. ................................. 365/185.21; 365/189.09
[58] Field of Search ................................. 365/45, 46, 73, 365/77, 78, 185.21, 189.09, 230.06

[56] References Cited

U.S. PATENT DOCUMENTS 5,963,462  10/1999  Engh et al. ............................... 365/45

Primary Examiner—Terrell W. Fears
Attorney, Agent, or Firm—Theodore E. Galanthay; Robert Iannucci; Seed IP Law Group PLLC

[57] ABSTRACT

An analog read circuit includes an output transistor connected to a memory cell to be read, and an operational amplifier having a non-inverting input connected to the drain terminal of the memory cell, an inverting input connected to a reference terminal, and an output, forming the output of the reading circuit and connected to the gate terminal of the output transistor. Bias transistors maintain the memory cell and the output transistor in the linear region, and the operational amplifier and the output transistor form a negative feedback loop so that the output voltage $V_O$ of the read circuit is linerly dependent upon the threshold voltage the memory cell. The reading circuit has high precision and high reading speed.

20 Claims, 2 Drawing Sheets

CIRCUIT FOR HIGH-PRECISION ANALOG READING OF NONVOLATILE MEMORY CELLS, IN PARTICULAR ANALOG OR MULTILEVEL FLASH OR EEPROM MEMORY CELLS

TECHNICAL FIELD

The present invention refers to a circuit for high-precision analog reading of nonvolatile memory cells, in particular analog or multilevel flash or EEPROM memory cells.

BACKGROUND OF THE INVENTION

As known and illustrated FIG. 1, a flash memory array 1 comprises a plurality of cells 2 arranged in rows and columns. The gate terminals of the cells arranged in a same row are connected to a respective word line 3, and the drain terminals of the cells belonging to a same column are to a respective bit line 4. The word lines 3 are connected to a row decoder 5, and the bit lines 4 are connected to a column decoder 6. A control unit 7 is connected with and supplies the decoders 5 and 6 with address and control signals for selecting, each time, only one word line 3 and only one bit line 4. Thereby, it is possible to access the cell 2 connected to the selected word and bit lines.

In particular, reading of a cell 2 can be done by biasing the selected word line 3 at a preset potential $V_{cpx}$ (for example, 6–7 V) and forcing a bias current $I_f$ in the selected bit line 4. If the selected cell is biased so that it may operate in the linear region, the value of the current $I_f$ is expressed by the following equation:

$$I_f = K*(W/L)*[(V_{cpx}-V_{th})*V_{DS}-V^2_{DS}/2] \quad (1)$$

wherein K is a constant linked to the cell fabrication process, (W/L) is the cell dimensional width/length ratio, $V_{th}$ is the cell threshold voltage (i.e., the minimum potential difference to be applied between the gate and source terminals of the cell for it to start conducting current), $V_{DS}$ is the drain-source voltage drop of the cell, and the term ($V_{cpx}-V_{th}$) is the overdrive of the cell.

When the cell is suitably biased, the potential difference $V_{DS}$ is constant, and the term $V^2_{DS}/2$ is negligble. Consequently, in the described conditions, the current $I_f$ flowing through the cell is linearly dependent upon the threshold voltage $V_{th}$.

The bit line 4 is connected with a sense amplifier having the task of detecting the current $I_f$ flowing in cell, and, in the case of analog reading, is able to supply an output signal correlated to the threshold voltage of the cell 2.

Different solutions are known for the structure of sense amplifiers for reading flash memory cells.

A first solution regards so-called direct reading amplifier circuits wherein the drain terminal of the cell to be read is connected to a load element through a bias transistor. In this case, the output of the sense amplifier is given by the potential at one terminal of the load element, normally a diode-connected MOS transistor (i.e., with gate and drain terminals short-circuited). The bias transistor limits the potential drop between the drain and source terminals of the cell to be read, so that the cell may work in the linear region, and the soft-programming phenomenon, i.e., undesired writing of the cell during the reading phase, may moreover be prevented.

Sense amplifiers of this kind are easy to manufacture but are subject to drawbacks that limit their precision. In particular, besides being affected by process variations and being sensitive to variations in temperature and supply voltage, they have reduced dynamics and poor linearity due to the presence of the diode-configuration MOS transistor.

A second solution comprises amplifier circuits with differential architecture. In this case, the current flowing in the cell to be read is compared with the current of a reference branch, which comprises a virgin flash cell identical to those of the memory array. The cell to be read and the reference cell are biased so as to present equal gate-to-source voltages and equal drain-to-source voltages. The cells are connected to respective loads through bias transistors having a topology similar to that of direct reading amplifiers. The voltages at the nodes connecting the loads to the respective cells, the difference of which depends upon the difference between the threshold voltage of the reference cell and the threshold voltage of the cell to be read, are supplied at input to an operational amplifier. The output of the latter can therefore be set with respect to the threshold voltage of the cell to be read.

This second solution reduces the dependence on the temperature and process variations, but it is not well suited to analog-type reading due to the operational amplifier operating in open loop. In addition, it has considerable overall dimensions due to the reference branch and, specifically, the reference flash cell. In fact, in order to obtain reliable performance, it is necessary to use an internal cell of a small array of flash cells, because a single cell is affected by edge effects.

A third solution is described in European Patent Application No. 97830172.9 filed on Apr. 15, 1997 in the name of ST Microelectronics, S.r.l., entitled "High-precision analog read circuit for memory arrays, in particular flash analog memory matrices", where a closed-loop circuit is described having a first branch comprising the cell to be read and a second branch comprising a reference cell. A current mirror forces equal currents in the two branches. The voltages of the drain terminals of the transistors of the current mirror are supplied to the inputs of an operational amplifier, having an output connected to the gate terminal of the reference cell. The described circuit configuration imposes that the cell to be read and the reference cell have the same overdrive voltage, so that the voltage at the output terminal of the operational amplifier (and hence at the gate terminal of the reference cell) is linearly dependent upon the threshold voltage of the cell to be read. This solution has the same drawbacks due to the presence of load transistors in diode configuration as the circuits according to the first solution and the same drawbacks due to the presence of reference cells as the circuits according to the second solution.

SUMMARY OF THE INVENTION

An embodiment of the present invention provides a circuit for high precision analog reading of nonvolatile memory cells that is free from the above described drawbacks.

BRIEF DESCRIPTION OF THE DRAWINGS

For a better understanding of the invention, a preferred embodiment thereof will now be described, as a non-limiting example and with reference to the attached drawings.

DETAILED DESCRIPTION OF THE INVENTION

Figure 1:
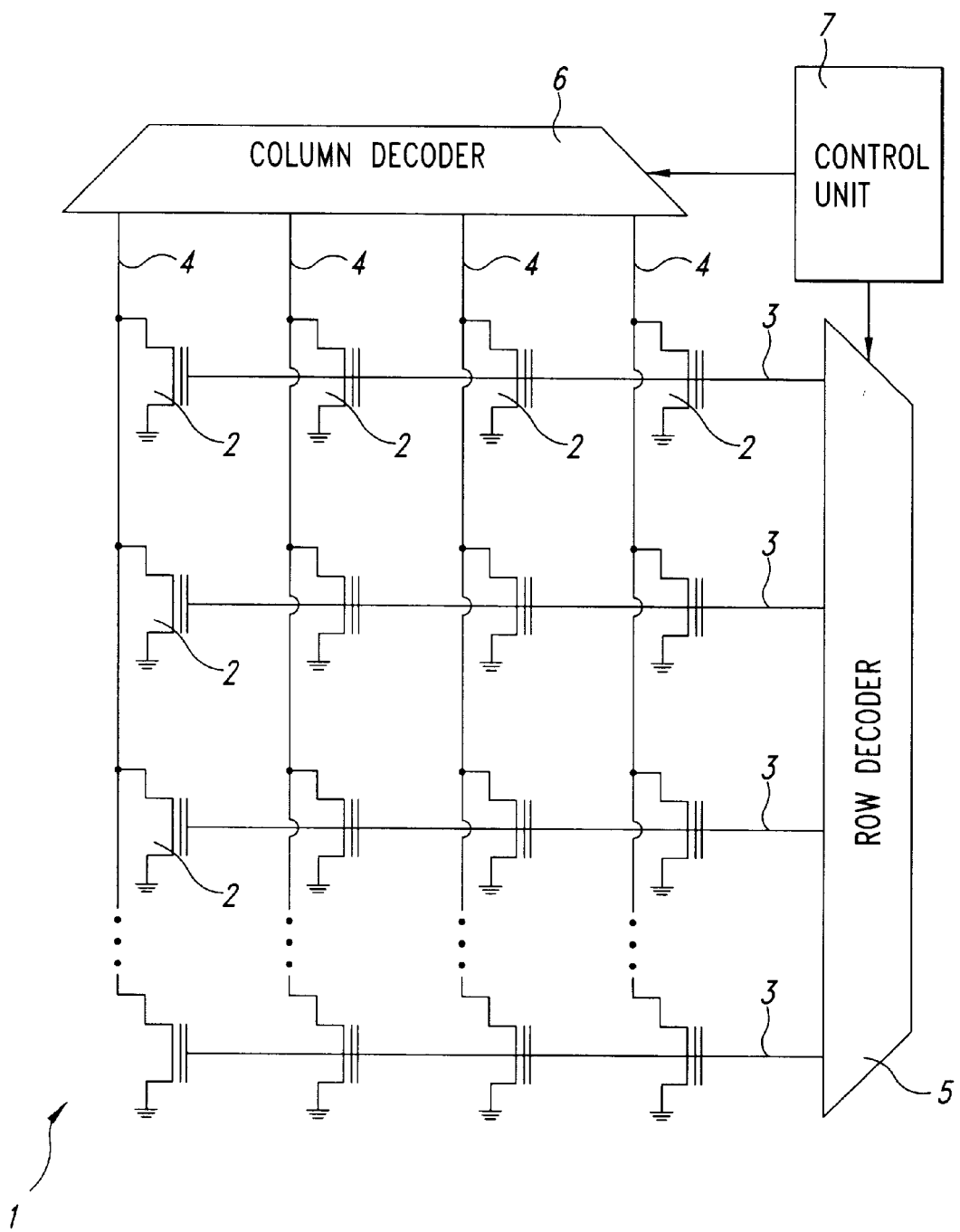
FIG. 1 illustrates a simplified circuit diagram of a flash analog memory array of a known type.
Figure 2:
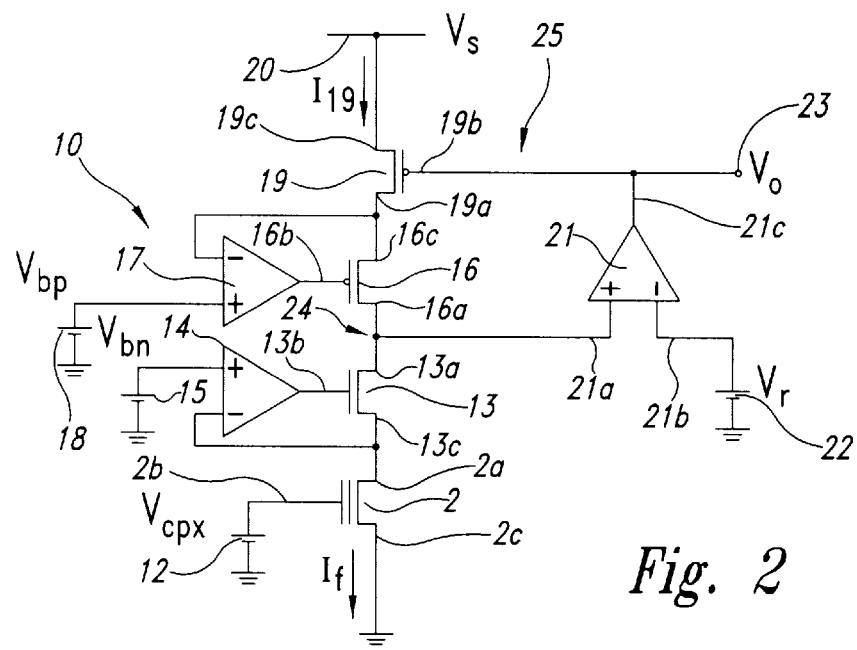
FIG. 2 presents a simplified reading circuit diagram for memory arrays, according to the present invention.

FIG. 2 shows a read circuit 10 for reading a memory cell 2 belonging to the memory array 1 of FIG. 1 not shown completely in FIG. 2.

The cell to be read 2 has a drain terminal 2a, a gate terminal 2b connected to a first voltage source 12 supplying 1 a read voltage $V_{cpx}$, and a source terminal 2c connected to ground.

A first bias transistor 13, of NMOS type, has a drain terminal 13a connected to a node 24, a gate terminal 13b, and a source terminal 13c connected to the drain terminal 2a of the cell to be read 2.

A first analog buffer 14 has an inverting input connected to a second voltage source 15 supplying a bias voltage $V_{Bn}$, and a non-inverting input connected with the source terminal 13c of the bias transistor 13. The buffer 14 further has an output connected with the gate terminal 13b of the bias transistor 13.

A second bias transistor 16, of PMOS type, has a drain terminal 16a connected to node 24, a gate terminal 16b, and a source terminal 16c.

A second analog buffer 17 has a non-inverting input connected to a third voltage source 18 supplying a bias voltage $V_{Bp}$, and an inverting input connected with the source terminal 16c of the bias transistor 16. The buffer 17 further has an output connected with the gate terminal 16c of the bias transistor 16.

An output transistor 19, of PMOS type, has a drain terminal 19a connected with the source terminal 16c, a gate terminal 19b connected to an output terminal 23 of the read circuit 10, and a source terminal 19c connected with a supply line 20.

An operational amplifier 21 has a non-inverting input 21a connected with the drain terminal 13a of the first bias transistor 13, an inverting input 21b connected with a fourth voltage source supplying a reference voltage $V_R$, and an output 21c connected to the output 23 supplying an output voltage $V_O$.

In practice, the operational amplifier 21, the output transistor 19, and the second bias transistor 16 define a feedback loop 25.

The operation of the read circuit 10 of FIG. 2 is the following.

The bias circuits formed by elements 13, 14 and 15 and elements 16, 17 and 18 have the function of keeping, respectively, the cell to be read 2 and the output transistor 19 in the linear region. In addition, the potential of the drain terminal 2a must be kept at a level sufficiently low to prevent the above phenomenon of soft programming of the cell 2. For this purpose, the drain terminals 2a of the cell 2 and 19a of the output transistor 19 are biased at the voltages $V_{Bn}$ and $V_{Bp}$ supplied, respectively, by the second voltage source 15 and by the third voltage source 18. In particular, the drain terminal 2a of the cell 2 is connected to the second voltage source 15 through the analog buffer 14 and the first bias transistor 13, while the drain terminal 19a of the output transistor 19 is connected to the third voltage source 18 through the second analog buffer 17 and the second bias transistor 16. The voltages $V_{Bn}$ and $V_{Bp}$ are chosen so that the potential differences between the drain terminal 2a of the cell 2 and ground, and between the drain terminal 19a of the output transistor 19 and the supply 20, are equal in absolute value, and preferably of approximately 0.2 V. Assuming, for instance, that the supply voltage $V_S$ is 10 V, $V_{Bn}$ is advantageously chosen equal to 0.2 V, while $V_{Bp}$ is chosen equal to 9.8 V.

During reading, the first voltage source 12 supplies the gate terminal 2b of the cell 2 with voltage $V_{cpx}$, of, for example, 6 V. Consequently, the current flowing in the cell 2 is:

$$I_f = K_f^*(W/L)_f^*[(V_{cpx}-V_{thf})^*V_{DSf}-V^2_{DSf}/2] \qquad (2)$$

where $K_f$ is a constant due to the fabrication process, $(W/L)_f$ is the dimensional width/length ratio, $V_{thf}$ is the threshold voltage, $V_{DSf}$ is the drain-to-source voltage drop, and the term $(V_{cpx}-V_{thf})$ is the overdrive of the cell to be read 2.

In the imposed bias conditions, the term $V^2_{DSf}/2$ is negligible if compared to the term $(V_{cpx}-V_{thf})^*V_{DSf}$, and Eq. (2) reduces to $$I_f = K_f^*(W/L)_f^*(V_{cpx}-V_{thf})^*V_{DSf} \qquad (3)$$

The operational amplifier 21, by acting in feedback on the gate terminal 19b of the output transistor 19, modifies the gate-to-source voltage of the latter so as to cause output transistor 19 to conduct a current $I_{19}$ equal to the current $I_f$ flowing in the cell to be read. The current of the output transistor 19 is given by the following equation:

$$I_{19} = K_{19}^*(W/L)_{19}^*[(V_O-V_S-V_{th19})^*V_{DS19}-V^2_{DS19}/2] \qquad (4)$$

in which the terms have the meanings indicated above, apart from the subscript 19 referred to the output transistor 19.

Again, for the bias conditions of the transistor 19 the term $V^2_{DS19}/2$ is negligible as compared to the term $(V_O-V_S-V_{th19})^*V_{DS19}$ and Eq. (4) reduces to $$I_{19} = K_{19}^*(W/L)_{19}^*(V_O-V_S-V_{th19})^*V_{DS19} \qquad (5)$$

In addition, as a result of the bias conditions imposed on the circuit, the drain-to-source voltages $V_{DSf}$ of the cell 2 and $V_{DS19}$ of the transistor 19 are known and constant.

Consequently, since currents $I_f$ and $I_{19}$ have the same value, by equating the second members of Eq. (3) and Eq. (5) and setting $$\alpha = [V_{DS19}^*K_{19}^*(W/L)_{19}]/[V_{DSf}^*K_f^*(W/L)_f] \qquad (6)$$

the following equation is obtained:

$$\alpha^*(V_O-V_S-V_{th19}) = V_{cpx}-V_{thf} \qquad (7)$$

Eq. (7) gives the value of the threshold $V_{thf}$ of the cell 2 as a function of the output voltage $V_O$ of the read circuit 10 according to the following relation:

$$V_{thf} = V_{cpx} - \alpha^*(V_O-V_S-V_{th19}) \qquad (8)$$

It follows that reading the voltage $V_O$ gives the sought threshold value $V_{thf}$, given that the threshold voltage $V_{th19}$ of the output transistor 19, as well as $V_{cpx}$ and $V_S$, are known.

In practice, the read circuit 10 of FIG. 2 is a two-stage amplifier wherein, in particular, the first stage is represented by the operational amplifier 21, and the second stage by the output transistor 19, and they are both contained in the feedback loop 25. In addition, the feedback loop 25 comprises the bias transistor 16, which acts as cascode element, supplying a high impedance to the non-inverting input 21a of the operational amplifier 21.

Figure 3:
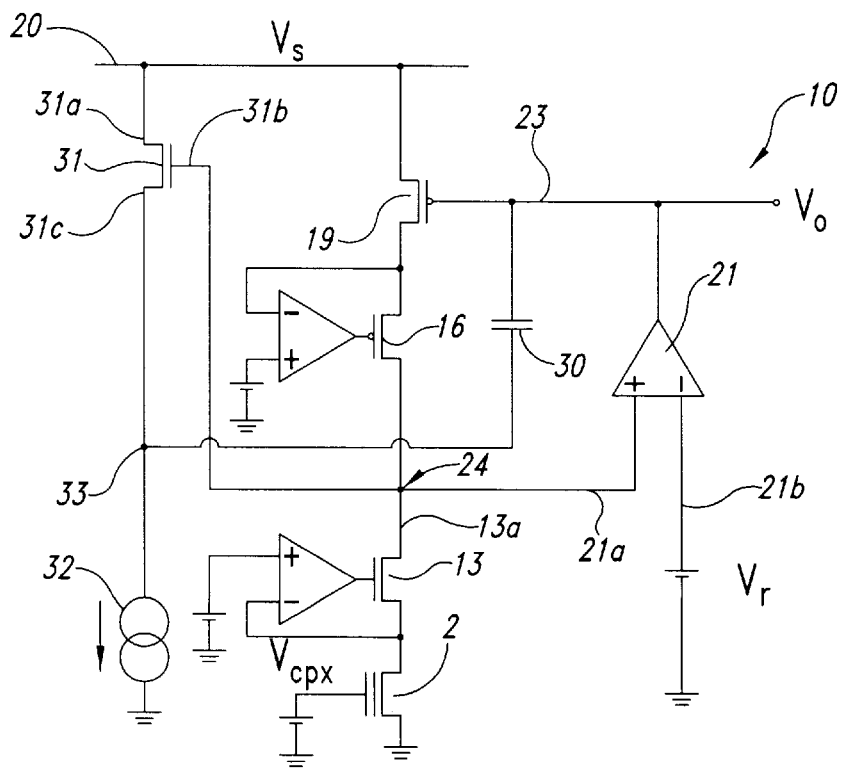
FIG. 3 illustrates a more detailed circuit diagram than the circuit of FIG. 2.

The two-stage amplifier can be compensated according to the more detailed circuit diagram shown in FIG. 3.

In detail, the read circuit 10 comprises the same components as in FIG. 2 and, in addition, a compensation capacitor 30, a compensation transistor 31, and a current source 32. The capacitor 30 is connected between the output terminal 23 and a node 33. The compensation transistor 31, of NMOS type, has a drain terminal 31a connected with the supply line 20, a gate terminal 31b connected with the drain terminal 13a of the first bias transistor 13, and a source terminal 31c connected with the node 33; the current source 32 is connected between the node 33 and ground.

The compensation capacitor 30, in accordance with Miller's theorem, modifies the transfer function of the amplifier formed by elements 16, 19, 21 and 30 (element 31 is neglected for the moment). Consequently, the transfer function has a unit gain frequency $F_{COMP}$ of $$F_{COMP} = \frac{1}{2\pi} \frac{Gm_{OP\_AMP}}{C_{COMP}}$$

where $Gm_{OP\_AMP}$ is the transconductance of the operational amplifier 21, and $C_{COMP}$ is the capacitance of the compensation capacitor 30.

The transfer function of the amplifier further has a second pole at the frequency $$F_{II} = \frac{1}{2\pi} \frac{Gm_{19}}{C_{24}}$$

where $Gm_{19}$ is the transconductance of the output transistor 19, and $C_{24}$ is the capacitance associated to the node 24.

For the stability of the read circuit 10, the unit gain frequency $F_{COMP}$ can at the most be equal to half the frequency $F_{11}$ of the second pole, which consequently limits the speed of the circuit. The transconductance of the output transistor 19 is low if compared to the transconductance of the operational amplifier 21, but also the capacitance $C_{24}$ associated to the node 24 is very low, since the drain terminal 19a has no load. Consequently, the circuit enables high reading speeds to be obtained.

The compensation capacitor 30 gives rise also to a zero in the right-hand half-plane at a frequency $F_Z$ of $$F_Z = \frac{1}{2\pi} \frac{Gm_{19}}{C_{COMP}}$$

As known to the those skilled in the art, this zero causes a 90° delay in the feedback loop, which consequently would become unstable. The problem is solved by virtue of compensation transistor 31, which, operating as a buffer in source follower configuration, decouples the second amplification stage (output transistor 19) from the capacitor 30.

The described read circuit has the following advantages. First, as compared to known direct read circuits, the output transistor 19 is not in diode configuration, but, on the basis of Eq. (5), operates as a linear amplifier element forming part of the feedback loop 25. Therefore, the read circuit 10 has greater linearity and dynamics. Furthermore, in the known circuits, the MOS transistor in diode configuration has parasitic capacitances which must be charged during the cell read phase, thus lengthening the read times. The elimination of the diode-connected MOS transistor in the read circuit 10 thus makes it possible to improve also the reading speed.

As compared to the solution described in the aforementioned European Patent Application No. 9780172.9, the read circuit 10 described herein is faster since it has one branch less, and the flash cell, and the corresponding bit line 4, are not included in the feedback loop. In addition, the described structure is circuitally simpler, since reference branches are not present, and the overall dimensions are reduced, since it is not necessary to provide an array of reference cells.

Finally, it is evident that modifications and variants can be made to the read circuit without departing front the scope of the present invention.

In particular, the bias circuits formed by elements 13, 14 and 15 and elements 16, 17 and 18, the function of which is basically that of setting the voltages of the drain terminals 2a and 19a so as to keep) the cell 2 and, respectively, the output transistor 19 in the linear region, can be replaced by voltage sources of a different type. For example, analog buffers 14 and 17 can be replaced by BAND or NOR gates each having an output connected with the gate terminal of the respective bias transistor, a first input connected with the source terminal of the bias transistor and receiving, at a second input, constant signals corresponding, respectively, to a logical 0 and 1.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A read circuit for high-precision analog reading of a memory cell having a first and a second terminal and a control terminal, the read circuit comprising a negative feedback loop including an amplifier circuit having a first and a second input and an output forming an output of said read circuit, said feedback loop further including a linear output amplifier having a first terminal connected with said first terminal of said memory cell, a second terminal connected with a first reference potential line and a control terminal connected to said output, wherein said first input of said amplifier circuit is connected to said first terminal of said memory cell, and said second input of said amplifier circuit is connected to a reference terminal.

2. The read circuit according to claim 1, wherein said memory cell is external to said feedback loop.

3. The read circuit according to claim 1 wherein said linear output amplifier means comprises a first MOS transistor.

4. The read circuit according to claim 1 wherein said amplifier circuit comprises an operational amplifier having a non-inverting input connected to said first terminal of said memory cell and an inverting input connected to said reference terminal.

5. The read circuit according to claim 1, further comprising a first voltage source connected between said first input of said amplifier circuit and said first terminal of said memory cell, and a second voltage source connected between said first input of said amplifier circuit and said first terminal of said linear output amplifier means.

6. The read circuit according to claim 5 wherein said first and second voltage sources comprise, respectively, second and third MOS transistors each having gate terminals connected to respective constant bias voltages.

7. The read circuit according to claim 6 wherein said second transistor is NMOS type, said third transistor is PMOS type, and said linear output amplifier comprises a PMOS transistor.

8. The read circuit according to claim 1, further comprising a compensation circuit arranged between said first terminal of said memory cell and said output of said amplifier circuit.

9. The circuit according to claim 8 wherein said compensation circuit comprises a compensation capacitor and a compensation transistor; said compensation capacitor being arranged between said output of said amplifier circuit and a first terminal of said compensation transistor; said compensation transistor having a second terminal connected to said first input of said amplifier circuit.

10. A memory comprising:

a memory cell having a control terminal and first and second terminals;

an output transistor having a first terminal connected with the first terminal of the memory cell, a second terminal connected with a first voltage reference and a control terminal connected to an output of the memory; and a first amplifier circuit having first and second inputs and second inputs and an output, the first input being coupled to the first terminal of the memory cell, and the second input being connected to a reference terminal, and the output being connected to the output of the memory.

11. The memory of claim 10, further comprising a bias circuit connected between the first input of the first amplifier circuit and the first terminal of the memory cell, the bias circuit including:

a bias transistor having first and second terminals and a control terminal, the first terminal being connected to the first input of the first amplifier circuit and the second terminal being connected to the first terminal of the memory cell; and a second amplifier circuit having a first and second inputs and an output, the first input being connected to a second voltage reference, the second input being connected to the first terminal of the memory cell, and the output being connected to the control terminal of the bias transistor.

12. The memory of claim 10, further comprising a bias circuit connected between the first terminal of the output transistor and the first input of the first amplifier circuit, the bias circuit including:

a bias transistor having first and second terminals and a control terminal, the first terminal being connected to the first input of the output transistor and the second terminal being connected to the first input of the first amplifier circuit; and a second amplifier circuit having first and second inputs and an output, the first input being connected to a second voltage reference, the second input being connected to the first terminal of the output transistor, and the output being connected to the control terminal of the bias transistor.

13. The memory of claim 10, further comprising:

a compensation capacitor having first and second plates, the first plate being coupled to the output of the first amplifier circuit; and a compensation transistor having first and second terminals and a control terminal, the first terminal being coupled to the first voltage reference, the second terminal being coupled to the second plate of the compensation capacitor, and the control terminal being coupled to the first terminal of the memory cell.

14. A read circuit for analog reading of a memory cell having first and second terminals and a control terminal, the read circuit comprising:

an output circuit having an input terminal connected with the first terminal of the memory cell and an output terminal forming an output of the read circuit;

a first bias transistor having first and second terminals and a control terminal, the first terminal being connected to the input of the output circuit and the second terminal being connected to the first terminal of the memory cell; and a first amplifier circuit having first and second inputs and second inputs and an output, the first input being connected to a first voltage reference, the second input being connected to the first terminal of the memory cell, and the output being connected to the control terminal of the first bias transistor.

15. The read circuit 14 wherein the output circuit includes:

an output transistor having first and second terminals and a control terminal, the first terminal being connected with a second voltage reference and the control terminal being connected to the output of the output circuit;

a second bias transistor having first and second terminals and a control terminal, the first terminal being connected to the second terminal of the output transistor and the second terminal of the second bias transistor being connected to the first terminal of the first bias transistor; and a second amplifier circuit having first and second inputs and an output, the first input being connected to a third voltage reference, the second input being connected to the second terminal of the output transistor, and the output being connected to the control terminal of the second bias transistor.

16. The read circuit of claim 15 wherein the output circuit further includes an output amplifier circuit having first and second inputs and an output, the first input being coupled to the first terminal of the first bias transistor, the second input being connected to a fourth voltage reference, and the output being connected to the output terminal of the output circuit.

17. The read circuit of claim 14, further comprising:

a compensation capacitor having first and second plates, the first plate being coupled to the output terminal of the output circuit; and a compensation transistor having first and second terminals and a control terminal, the first terminal being coupled to a second voltage reference, the second terminal being coupled to the second plate of the compensation capacitor, and the control terminal being coupled to the first terminal of the memory cell.

18. A method of reading a memory cell having first and second terminals and a control terminal using a read circuit that includes an output transistor, the method comprising:

driving the control terminal of the memory cell with a first voltage;

driving a conduction terminal of the output transistor with a second voltage;

comparing an intermediate voltage taken between the output transistor and the memory cell with a reference voltage;

outputting an output signal based on the comparing step; and transmitting the output signal to the control terminal of the output transistor.

19. The method of claim 18, further comprising biasing the memory cell to operate in a linear region during reading using a bias circuit coupled between the memory cell and the output transistor, wherein the intermediate voltage is taken at a first terminal of the bias circuit which has a second terminal coupled to the memory cell.

20. The method of claim 18 wherein first and second bias transistors are coupled between the output transistor and the memory cell and the intermediate voltage is taken between the first and second bias transistors.

* * * * *